United States Patent [19]
Yoshida

[11] Patent Number: 5,470,426
[45] Date of Patent: Nov. 28, 1995

[54] PLASMA PROCESSING APPARATUS

[75] Inventor: Kazuyoshi Yoshida, Tokyo, Japan

[73] Assignee: NEC Corporation, Tokyo, Japan

[21] Appl. No.: 330,375

[22] Filed: Oct. 27, 1994

[30] Foreign Application Priority Data

Oct. 29, 1993 [JP] Japan ................................. 5-294657

[51] Int. Cl.$^6$ ......................................... B44C 1/22
[52] U.S. Cl. ............................................. 156/345; 216/67
[58] Field of Search ............................... 156/345, 643.1;
204/298.37; 216/67, 70

[56] References Cited

U.S. PATENT DOCUMENTS

| 4,826,585 | 5/1989 | Davis | 204/298.37 |
| 5,304,279 | 4/1994 | Coultas et al. | 204/298.37 X |

FOREIGN PATENT DOCUMENTS 2-51228  2/1990  Japan .

*Primary Examiner*—William Powell
*Attorney, Agent, or Firm*—Sughrue, Mion, Zinn, Macpeak & Seas

[57] ABSTRACT

A plasma processing apparatus includes a high-frequency electric field generating mechanism, having a pair of opposing electrodes arranged in a reaction vessel, for generating a high-frequency electric field between the electrodes, and a magnetic field generating mechanism constituted by a magnetic field generating coil arranged outside the reaction vessel to generate a magnetic field which does not spatially overlap the high-frequency electric field generated by the high-frequency electric field generating mechanism. When a reaction gas is supplied into the reaction vessel, and a high-frequency power is supplied to the magnetic field generating coil, a plasma is produced by a magnetic field formed in the form of a solenoid. Since the magnetic field does not spatially overlap the high-frequency electric field generated by the high-frequency electric field generating mechanism, a plasma density and ion energy can be independently controlled during dry etching for a wafer, and the influence of a magnetic field on the wafer can be prevented.

4 Claims, 3 Drawing Sheets

PLASMA PROCESSING APPARATUS

BACKGROUND OF THE INVENTION

1. Field of the Invention

The present invention relates to a plasma processing apparatus used for manufacturing a semiconductor device.

2. Description of the Prior Art

A conventional plasma processing apparatus which utilizes the interaction between an electric field and a magnetic field for manufacturing a semiconductor device is described in Japanese Patent Laid-Open No. 2-51228. The arrangement of this prior art will be described below with reference to FIG. 1.

FIG. 1 is a sectional view showing an arrangement of a conventional plasma processing apparatus described in the above publication. This plasma processing apparatus is used as a dry etching apparatus and has a high-frequency electric field generating mechanism and a magnetic field generating mechanism which are in a reaction vessel 1. In addition, the reaction vessel 1 has an inlet port (not shown) for receiving an etching gas and an exhaust port 1a for exhausting the gas.

The high-frequency electric field generating mechanism has a pair of opposed electrodes constituted by an upper electrode 2 and a lower electrode 3, and a high-frequency power supply 4 for supplying a high-frequency power to these electrodes. The magnetic field generating mechanism is constituted by a plurality of magnetic field generating coils 5 arranged to surround the pair of electrodes 2 and 3. The magnetic field generating coils 5 are constituted by, e.g., solenoid coils 5a to 5f, and are connected to pulse power supplies 6a to 6f of a pulse voltage generator 6, respectively.

Dry etching performed by the plasma processing apparatus arranged as described above is performed as follows.

A wafer 7 serving as a material to be etched is placed at a predetermined position on the lower electrode 3, and an etching gas is supplied into the reaction vessel 1. At the same time, the etching gas is exhausted from the exhaust port 1a, and the pressure in the reaction vessel 1 is controlled to be a predetermined gas pressure.

In this state, when a high-frequency power is supplied from the high-frequency power supply 4 to the lower electrode 3, a high-frequency electric field having a direction indicated by an arrow E is formed between the electrodes 2 and 3 so as to produce a plasma 8. At this time, when periodic pulse voltages from the pulse voltage generator 6 are applied to the solenoid coils 5a to 5f serving as the magnetic field generating coils 5, a periodic magnetic field is generated in the direction indicated by an arrow F perpendicular to the high-frequency electric field. For this reason, the electric field and the magnetic field which are perpendicular to each other act on electrons in the plasma 8 to cause the electrons to perform cycloid movement, and the etching gas is effectively dissociated, thereby improving dissociation efficiency. In this manner, dry etching is performed for the wafer 7.

In this prior art, pulse voltages are periodically applied from the pulse voltage generator 6 to the magnetic field generating coils 5, and the ratio or the like of these pulse voltages is changed, thereby controlling the strength of a magnetic field or the uniformity of the distribution of the magnetic field.

In recent years, with an increase in degree of the integration density of a semiconductor device, a highly precise patterning technique becomes important. For this reason, a dry etching technique which can be used at a low pressure, can obtain a high etching rate, and is free from damage is required and dispensable.

However, in a plasma processing apparatus having the above arrangement, the following problems are posed. That is, magnetic field control is complicate, and the gate oxide film of a wafer is degraded or broken down due to localization of the charges of charged particles (charge-up damage).

More specifically, in the above plasma processing apparatus, a pulse voltage generator 6 and the plurality of magnetic field generating coils 5 arranged to surround the pair of electrodes 2 and 3 are used as the magnetic field generating mechanism. For this reason, the plurality of pulse power supplies 6a to 6f must be controlled to make a magnetic field on the surface of the wafer 7 uniform, resulting in complex magnetic field control. In addition, since the magnetic field generated by the magnetic field generating coils 5 is parallel to the surface of the wafer 7, charged particles are localized by the interaction between the electric field and the magnetic field. For this reason, nonuniformity of charges occurs on the surface of the wafer 7. This nonuniformity of charges may cause charge-up damage.

SUMMARY OF THE INVENTION

The present invention has been made in consideration of the above problems, and has its object to provide a plasma processing apparatus in which a uniform high-density plasma is produced by a simple magnetic field control means, a uniform etching rate is realized, and charge-up damage is reduced.

In order to achieve the above object, according to the present invention, a plasma processing apparatus comprises a high-frequency electric field generating mechanism, having a pair of opposing electrodes arranged in a reaction vessel, for generating a high-frequency electric field between the electrodes, and a magnetic field generating mechanism constituted by a magnetic field generating coil arranged outside the reaction vessel to generate a magnetic field which does not spatially overlap the high-frequency electric field generated by the high-frequency electric field generating mechanism.

When a reaction gas is supplied into a reaction vessel, and a high-frequency power is supplied to a magnetic field generating coil, a plasma is produced by a magnetic field formed in the form of a solenoid. However, the magnetic field does not spatially overlap a high-frequency electric field generated by a high-frequency electric field generating mechanism. For this reason, when dry etching is to be performed to a wafer, a plasma density and ion energy can be independently controlled, and the influence of the magnetic field on the wafer can be prevented.

DETAILED DESCRIPTION OF THE PREFERRED EMBODIMENT

An embodiment of the present invention will be described below with reference to the accompanying drawings.

Figure 2A:
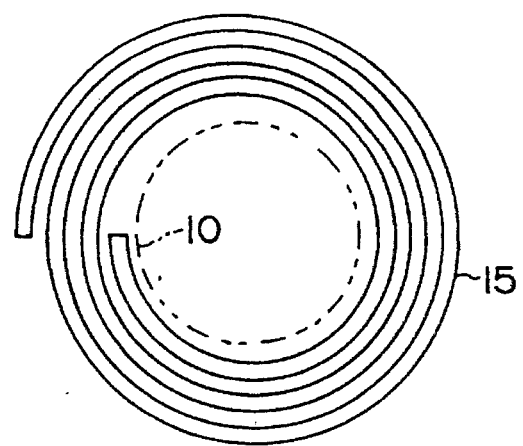
FIG. 2A is a plan view showing the shape of the coil of a plasma processing apparatus according to the first embodiment of the present invention.
Figure 2B:
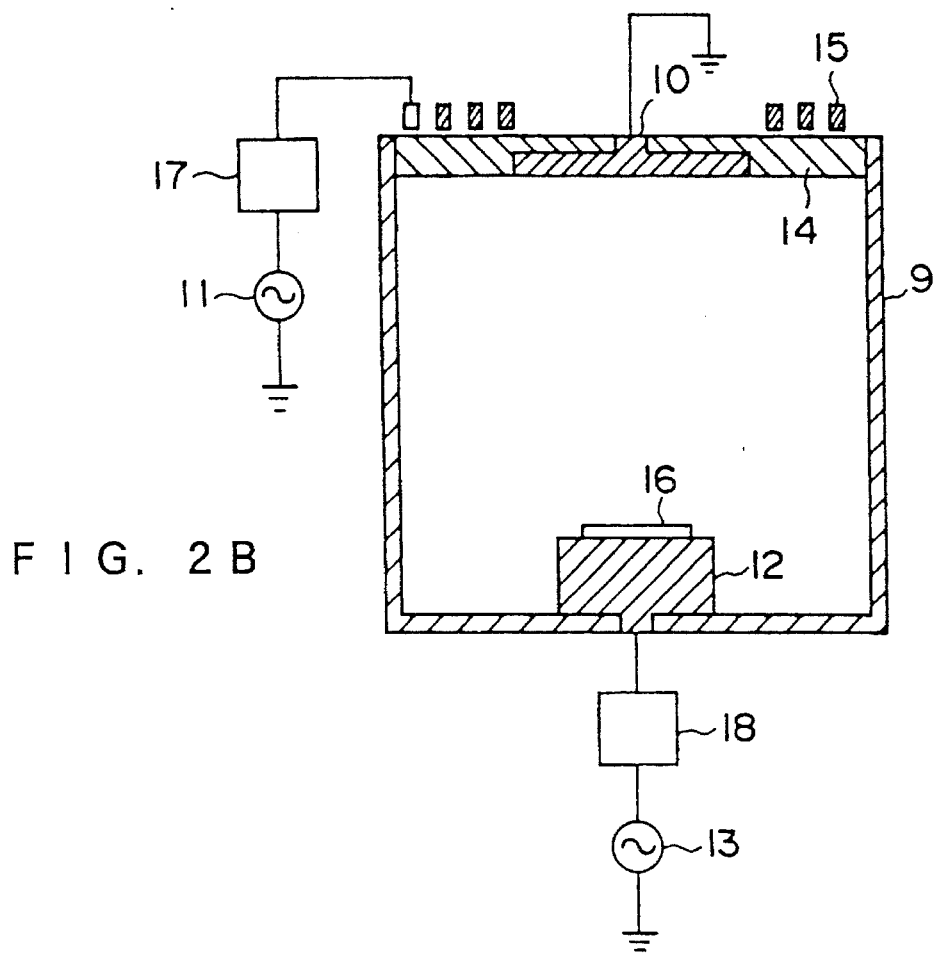
FIG. 2B is a sectional view showing the plasma processing apparatus.

FIG. 2A is a plan view showing the shape of the coil of a plasma processing apparatus according to the embodiment of the present invention, and FIG. 2B is a sectional view showing the plasma processing apparatus.

Figure 1:
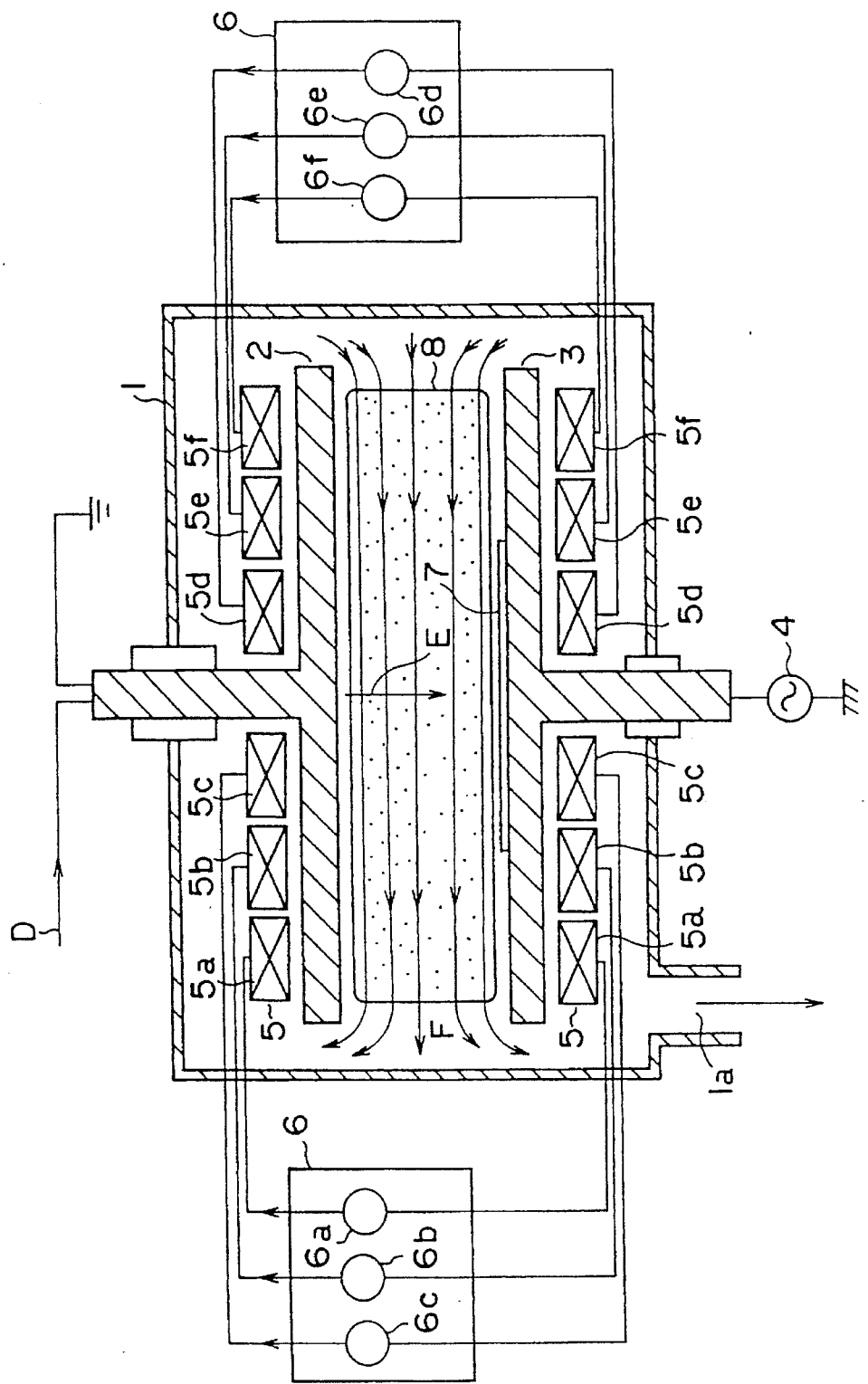
FIG. 1 is a sectional view showing an arrangement of a conventional plasma processing apparatus.

A pair of opposing electrodes constituted by an upper electrode 10 and a lower electrode 12 are arranged in a reaction vessel 9. The upper electrode 10 is arranged to be buried in an insulating plate 14, and a high-frequency power supply 13 is connected to the lower electrode 12 through a matching box 18. Above the reaction vessel 9, a spiral coil 15 is arranged not to overlap the upper electrode 10 when viewed from the upper direction of the reaction vessel 9, as indicated by the chain double-dashed line in FIG. 2A. In this embodiment, the coil 15 is arranged above the insulating plate 14. A high-frequency power supply 11 is connected to the spiral coil 15 through a matching box 17. In addition, although not shown in FIG. 1, a reaction gas supply mechanism and an exhaust mechanism are arranged.

Dry etching by the plasma processing apparatus arranged as described above will be performed as follows.

A wafer 16 serving as a material to be etched is placed at a predetermined position on the lower electrode 12, and a reaction gas is supplied into the reaction vessel 9. At the same time, the reaction gas is exhausted so that the pressure in the reaction vessel 9 is controlled to be a predetermined pressure. In this state, when a high-frequency power is supplied from the high-frequency power supply 11 to the spiral coil 15, a plasma is produced. A process of producing this plasma will be explained below.

A magnetic field extending through the insulating plate 14 is induced and formed from the spiral coil 15 by the supplied high-frequency power. This magnetic field is a solenoid-shaped magnetic field, and is almost perpendicular to the surface of the insulating plate 14 immediately under the insulating plate 14. Due to the magnetic field, electrons are rotationally moved in the form of a spiral, the electrons which rotationally moved and repeatedly collide with gas molecules. As a result, a planar high-density plasma is produced.

The strength of a magnetic field formed by the spiral coil 15 exponentially decreases as a function of the distance from and the spiral coil 15. The magnetic field formed by the spiral coil 15 is a solenoid-shaped magnetic field. For this reason, since the produced plasma has almost no magnetic field, the magnetic field near the wafer 16 is very weak. Therefore, a problem caused by a magnetic field which is present near a wafer, more specifically, a problem such as charge-up damage can be prevented.

When advanced anisotropic etching is to be performed, direction-controlled ions having uniform energy must be obtained. These ions can be obtained by applying a high-frequency power from the high-frequency power supply 13 across the pair of electrodes 10 and 12 arranged in the reaction vessel 9. When the high-frequency power from the high-frequency power supply 13 is applied across the opposing electrodes 10 and 12, an electric field perpendicular to the wafer 16 is generated. When the area of the upper electrode 10 is changed, the magnitude and direction of the electric field on the wafer 16 can be uniformed. Therefore, a uniform etching rate can be realized. The high-frequency power supply 11 for applying a power to the spiral coil 15 and the high-frequency power supply 13 for applying a power to the lower electrode are respectively designed to be operated at different frequencies to solve a problem such as resonance.

As described above, the present invention has the following characteristic feature. That is, a plasma density can be controlled by applying a high-frequency power to the spiral coil 15 independently of ion energy controlled by applying a high-frequency power across the opposing electrodes 10 and 12.

When the upper electrode 10 which is grounded and the spiral coil 15 are arranged to overlap one another when viewed from the upper direction, a problem that a plasma cannot be easily produced because of the interaction between the upper electrode 10 and the spiral coil 15 may be posed. For this reason, according to the present invention, it is important that the spiral coil 15 and the upper electrode 10 are arranged not to overlap each other. In addition, with the above arrangement, a high-frequency electric field generated between the opposing electrodes 10 and 12 by applying a high-frequency power from the high-frequency power supply 13 and a magnetic field formed by applying a high-frequency power from the high-frequency power supply 11 to the spiral coil 15 are arranged not to spatially overlap each other.

Note that the present invention is not limited to the embodiment shown in FIGS. 2A and 2B, and various modifications can be effected. For example, the following modifications may be effected.

(1) In FIGS. 2A and 2B, the shape of the spiral coil, and the number of turns can be freely changed in accordance with applications without being limited to the shape of the spiral coils and the number of turns shown in FIGS. 2A and 2B.

Figure 3:
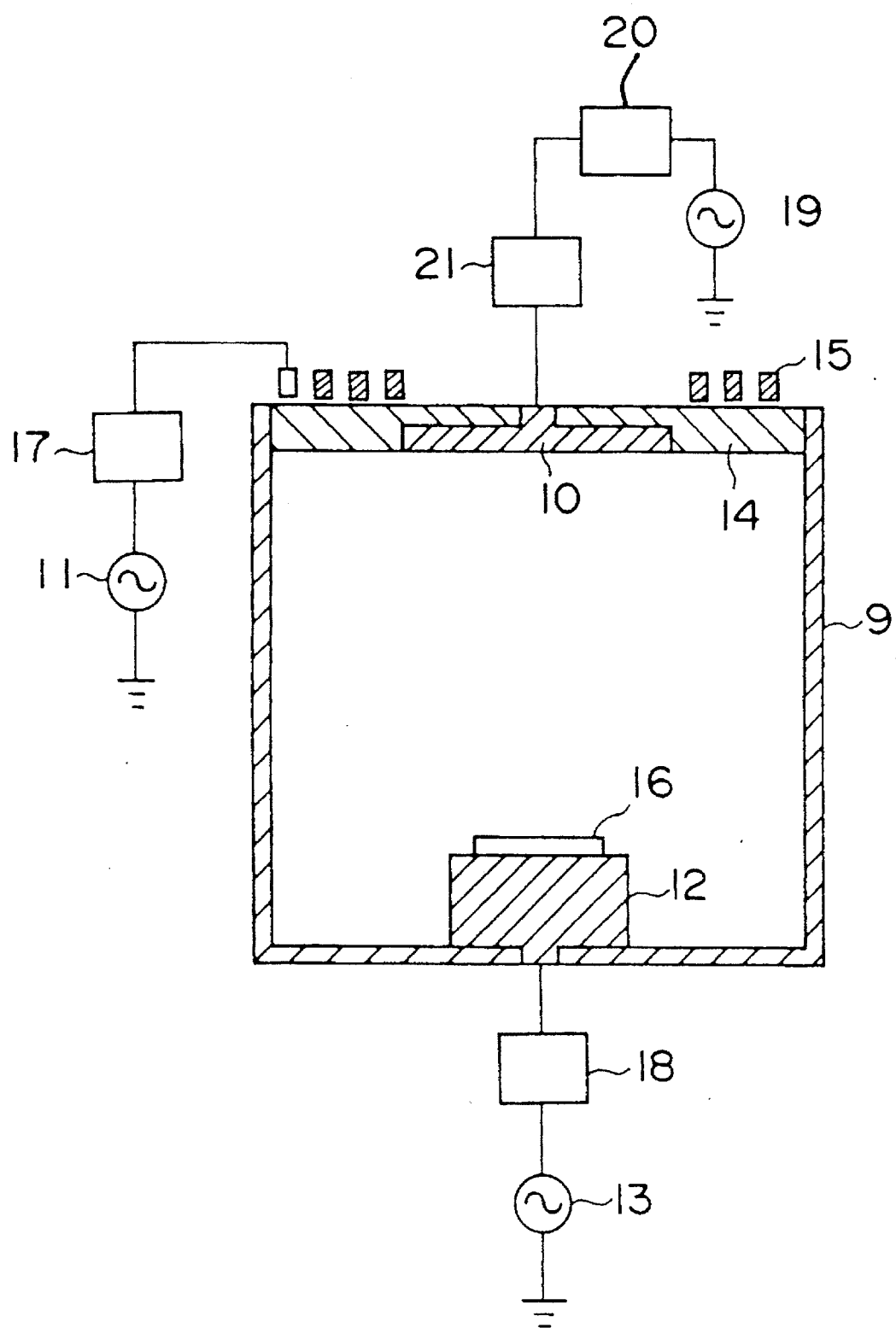
FIG. 3 is a sectional view showing a plasma processing apparatus according to the second embodiment of the present invention.

(2) As in the second embodiment shown in FIG. 3, high-frequency powers can be applied to both the upper and lower electrodes 10 and 12, respectively. The second embodiment will be described below.

A plasma processing apparatus according to the second embodiment shown in FIG. 3 has a mechanism for applying high-frequency powers to both upper and lower electrodes 10 and 12, and has an arrangement having a phase shifting mechanism 20 arranged between the upper electrode 10 and a high-frequency power supply 19. Since the remaining portions of this apparatus are the same as those of the first embodiment, the same reference numerals as in the first embodiment denote the same parts in the second embodiment, and a description thereof will be omitted.

In the above arrangement, high-frequency powers having the same frequency, e.g., 13.56 MHz, are applied to the upper electrode 10 and the lower electrode 12, respectively. At this time, the phase of the high-frequency power applied to the upper electrode 10 can be changed with respect to the phase of the high-frequency power applied to the lower electrode 12. When the phases of the high-frequency powers respectively applied to the upper electrode 10 and the lower electrode 12 are shifted from each other, ion energy can be freely changed without changing a plasma state. For example, when the phase is changed by 180°, on a wafer 16, ion energy equal to ion energy obtained by applying a high-frequency power of 100 W to only the lower electrode 12 can be obtained by respectively applying high-frequency powers of 50 W to the upper electrode 10 and the lower electrode 12. Therefore, since an action smaller than an action caused between the inner wall of a reaction vessel 9 and a plasm when the high-frequency power is applied to only the lower electrode 12 can be obtained, the stable plasma can be advantageously obtained.

As has been described above, according to the present invention, a spiral coil for producing a plasma is arranged above the reaction vessel of a plasma processing apparatus, and an upper electrode is arranged not to overlap the coil when viewed from the upper direction of the reaction vessel. For this reason, since a plasma density and ion energy can be independently controlled, a uniform high-density plasma can be produced, and direction-controlled ions having uniform energy can be obtained. Therefore, a uniform etching rate with respect to a wafer can be realized.

In addition, a magnetic field generated by the spiral coil exponentially decreases as a function of the distance between the magnetic field and the coil, and is a solenoid-shaped magnetic field. For this reason, the strength of the magnetic field on the wafer surface is almost zero. Therefore, a problem such as charge-up damage in the presence of a magnetic field is not posed.

What is claimed is:

1. A plasma processing apparatus comprising a high-frequency electric field generating mechanism, having a pair of opposing electrodes arranged in a reaction vessel, for generating a high-frequency electric field between said electrodes, and a magnetic field generating mechanism constituted by a magnetic field generating coil arranged outside said reaction vessel to generate a magnetic field which does not spatially overlap the high-frequency electric field generated by said high-frequency electric field generating mechanism.

2. An apparatus according to claim 1, wherein said magnetic field generating mechanism is constituted by a spiral coil for generating a magnetic field.

3. An apparatus according to claim 1, wherein a high-frequency power supply to which at least one of said pair of electrodes included in said high-frequency electric field generating mechanism is connected and a high-frequency power supply to which said magnetic field generating coil is connected are respectively operated at different frequencies.

4. An apparatus according to claim 1, wherein said pair of electrodes included in said high-frequency electric field generating mechanism are connected to high-frequency power supplies, respectively, and further comprising a phase shifting mechanism for changing phases of high-frequency powers respectively applied to said electrodes.

* * * * *